US006842867B2

(12) United States Patent
Cooper

(10) Patent No.: US 6,842,867 B2
(45) Date of Patent: Jan. 11, 2005

(54) SYSTEM AND METHOD FOR IDENTIFYING MEMORY MODULES HAVING A FAILING OR DEFECTIVE ADDRESS

(75) Inventor: Stephen Ray Cooper, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 417 days.

(21) Appl. No.: 09/770,523

(22) Filed: Jan. 26, 2001

(65) Prior Publication Data

US 2002/0104045 A1 Aug. 1, 2002

(51) Int. Cl.⁷ .............................................. G06F 11/00
(52) U.S. Cl. ......................................... 714/42; 714/54
(58) Field of Search ........................... 714/42, 5, 6, 29, 714/54, 702, 718; 711/5, 6, 111, 202, 203

(56) References Cited

U.S. PATENT DOCUMENTS

| 4,532,628 A | | 7/1985 | Matthews |
| 4,891,811 A | | 1/1990 | Ash et al. |
| 4,942,579 A | * | 7/1990 | Goodlander et al. ........ 714/805 |
| 5,267,242 A | | 11/1993 | Lavallee et al. |
| 5,423,028 A | | 6/1995 | Schieve et al. ............. 395/575 |
| 5,502,814 A | | 3/1996 | Yuuki et al. |
| 5,511,164 A | | 4/1996 | Brunmeier et al. |
| 5,592,616 A | | 1/1997 | Finch et al. ........... 395/183.18 |
| 5,638,527 A | | 6/1997 | Parks et al. .................. 395/412 |
| 5,666,371 A | | 9/1997 | Purdham |
| 5,758,056 A | | 5/1998 | Barr |
| 5,867,642 A | | 2/1999 | Vivio et al. ............ 395/182.06 |
| 5,881,072 A | | 3/1999 | Dell |
| 6,041,422 A | * | 3/2000 | Deas .............................. 714/8 |
| 6,363,502 B1 | * | 3/2002 | Jeddeloh ....................... 714/52 |
| 6,430,702 B1 | * | 8/2002 | Santeler et al. ................. 714/6 |

FOREIGN PATENT DOCUMENTS

| WO | WO 97/04328 | 2/1997 |
| WO | WO 98/00781 | 1/1998 |

OTHER PUBLICATIONS

U.S. Pending Appl. No. 08/727,256 entitled "Method of Testing Detection and Correction Capabilities of ECC Memory Controller" by Steve Cooper, Assignee–Dell USA L.P., Oct. 8, 1996.

U.S. Pending Appl. No. 09/413,599 entitled "Graphical Interface, Method, and System for the Provision of Diagnostic and Support Services in a Computer System" by Roy William Stedman, et al., Assignee–Dell USA L.P., Oct. 6, 1999.

* cited by examiner

Primary Examiner—Dieu-Minh Le
(74) Attorney, Agent, or Firm—Baker Botts L.L.P.

(57) ABSTRACT

A method is provided for identifying in a computer system physical memory modules having failing or defective addresses. The transparent error correction function of the computer system is disabled and system memory is tested. If an error is detected, a coded data value that indicative of a single-bit error is written to the failing or defective memory address. The failing or defective memory address is read in and the incorrect data value in the memory address is detected. The address of the failing of defective memory address is recorded and mapped or correlated to a physical memory module.

21 Claims, 2 Drawing Sheets

SYSTEM AND METHOD FOR IDENTIFYING MEMORY MODULES HAVING A FAILING OR DEFECTIVE ADDRESS

TECHNICAL FIELD OF THE INVENTION

The present disclosure relates generally to the field of computer memory and, more particularly, to a system and method for locating memory modules with a failing or defective memory.

BACKGROUND

Error correction is the process of detecting bit errors in memory and correcting them. Known error correction techniques can resolve both single-bit and multi-bit errors. In computer systems, information is represented in binary format (1s and 0s). When binary information is passed from one point to another, a mistake can be made in that a binary 1 can interpreted as a binary 0, or a binary 0 can be interpreted as a binary 1. An error of this sort can be caused by media defects, electronic noise, component failures, poor connections, deterioration due to age, and other factors. When a bit is mistakenly interpreted, a bit error has occurred. Memory error correction methods often involve the addition of extra bits or letters to binary words. The extra letters (bits) add an additional data structure to each word. If the content of the data binary word is altered, the content of the binary word will no longer correspond or map to the data of the appended data structure, and the memory error can be detected and corrected.

Error correction is necessary to insure the accuracy and integrity of data and, in some cases, to assist in the operation of fault tolerant computer systems. It is expected that virtually every digital data transmission or storage system makes errors at a certain rate. As data transfer rates and storage densities increase, the error rate also increases. Some digital systems experience more errors than others. For instance, an optical disk has a higher error rate than a magnetic disk. A magnetic tape has a higher error rate than a magnetic disk. Without some form of error detection and correction, most storage devices would be too unreliable to be useful. In virtually all digital systems, as transfer rates increase and designers squeeze more bits into smaller spaces, errors occur more frequently. In sum, as speed and density increase, error correction becomes a necessity.

A common solution for error correction in the memory of a computer system is ECC (error correction code) checking. ECC checking involves a comparison of the data value of the data address and an additional data structure that is appended to or associated with each data value. ECC checking allows the detection of both single-bit and multi-bit memory errors and the transparent correction of single-bit errors. ECC checking involves the creation of data structure that is appended to or associated with the data content of the memory address. The ECC data structure contains sufficient detail to permit the recovery of a single-bit error in the protected data content. ECC checking typically uses a data structure of 7 bits to perform error checking and single-bit correction on a data string of 32 bits, or a data structure of 8 bits to perform error checking and single-bit correction on a data string of 64 bits.

In some ECC checking schemes, multi-bit errors can be both identified and corrected. In many instances, however, multi-bit errors cannot be corrected and the computer system must halt. When a multi-bit error occurs, a non-maskable interrupt (NMI) is often issued that instructs the system to shut down to avoid data corruption. Although occurring less frequently than single-bit errors, multi-bit errors cause more severe problems because they often result in the computer system being halted. In comparison, a single-bit error will not cause the computer system to halt, and ECC checking may transparently correct the error.

Although ECC checking involves the transparent correction of memory errors in the computer system, system administrators and computer users often find it useful to know that an error has occurred, the time that the error occurred, the frequency of the occurrence of the error, and if the error has been corrected. A pattern of errors, for example, can indicate a hardware problem that needs to be addressed or that a piece of hardware, such as a memory module, needs to be replaced. The logging of errors that have been identified and corrected by an ECC checking routine is often inadequate. In many systems, the size of the log is limited so that only a limited number of errors, perhaps only a single error, can be logged, and with each successive error writing over the logged information for the previous error. In addition, because ECC checking runs continuously and corrects errors transparently, error identification and checking often occurs without any involvement on the part of the user, limiting the ability of a system administrator to know about and perform a standalone analysis of a single failing memory address. In sum, although a number of memory errors may be identified and corrected through ECC checking, only a small subset of those errors are logged for later analysis. Many errors occur and are corrected without any record of the presence or correction. As such, these errors, for which there is no record of their presence or correction, are corrected without any record of their correction being available to the administrator or user of the computer system.

Because the error logging of ECC checking is generally inadequate and because error correction for single bit errors occurs automatically and transparently, a system administrator may not appreciate the frequency and severity of memory errors in the computer system. In addition, because only a small subset of the defective memory addresses are logged by the ECC checking routine, the administrator is not aware of the physical memory modules that include the defective or failing memory addresses. When ECC checking is enabled, a recurring single-bit error requires that repetitive corrective steps be executed to correct the error. While it is possible that a computer system with a failing memory module can continue to operate despite the repeated error in the memory module, the computer system will function at a level that is below its normal capacity for handling memory accesses, as the single-bit error that is caused by a failing memory module may have to be repaired each time the system reads from the address of the damaged memory module. The sum of these repetitive steps to correct recurring errors caused by a defective memory module unnecessarily burdens the system memory and degrades system performance. In addition to the performance concerns caused by the automatic correction of single-bit errors, the detection of any multi-bit error during ECC checking will typically cause the computer system to halt. Thus, although ECC checking provides for the automated and often transparent correction of memory errors, the process of correcting those errors may actually hinder the performance of the computer system in that the administrator or use of the computer system will not recognize constraints on the computer system caused by the repeated failure of physical memory modules.

SUMMARY

In accordance with the present disclosure, a method and system is provided for identifying physical memory modules on the basis of failing or defective memory addresses. To locate the physical memory module associated with a failing or defective address, the transparent error correction function of the computer system is disabled, if enabled, and system memory is tested. If an error is detected, a coded data value that is indicative of a single-bit error is written to the failing or defective memory address. The failing or defective memory address is next read in from memory and the incorrect data value in the memory address is detected. The address of the failing or defective memory address is recorded and mapped or correlated to a physical memory module. The transparent error correction routine is returned to its original operational state.

An advantage of the present invention is that by correctly identifying the failing memory address and correlating that address to a physical memory module, appropriate corrective actions may be taken with respect to the physical memory module that includes the failing or defective memory address location. The method and system described herein is advantageous in that it permits the user to evaluate memory errors individually or in groups at the preference of the user. The injection of a single-bit error in a memory address can occur with respect to only one error or multiple errors, allowing the user or administrator to focus on or evaluate a limited group of errors. The method and system disclosed herein is also advantageous in that it incorporates existing memory functionality, including the built-in logic, of the computer system. The method disclosed herein takes advantage of known routines for reading and writing data to memory locations, and mapping memory addresses to physical memory modules. Because of the incorporation of existing routines of the computer system in the disclosed method, the disclosed method is able to accomplish the result of locating physical memory modules for failing or defective memory addresses without having to substantially rewrite or develop a set of new routines to accomplish the same result. As a result, the method of the present disclosure may be used with any computer system so long as the computer system includes a set of logic routines for memory access and memory management.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The present disclosure concerns a system and method for identifying physical memory modules having a defective or failing memory address. The method and system described herein is especially applicable in those computer systems that employ a transparent error correction scheme, such as ECC checking that automatically and transparently corrects errors, including recurrent errors, in the memory of the computer system. The method described herein takes advantage of the advantages of ECC checking and other memory diagnostic tools to identify those physical memory modules having failing or defective memory addresses.

Figure 1:
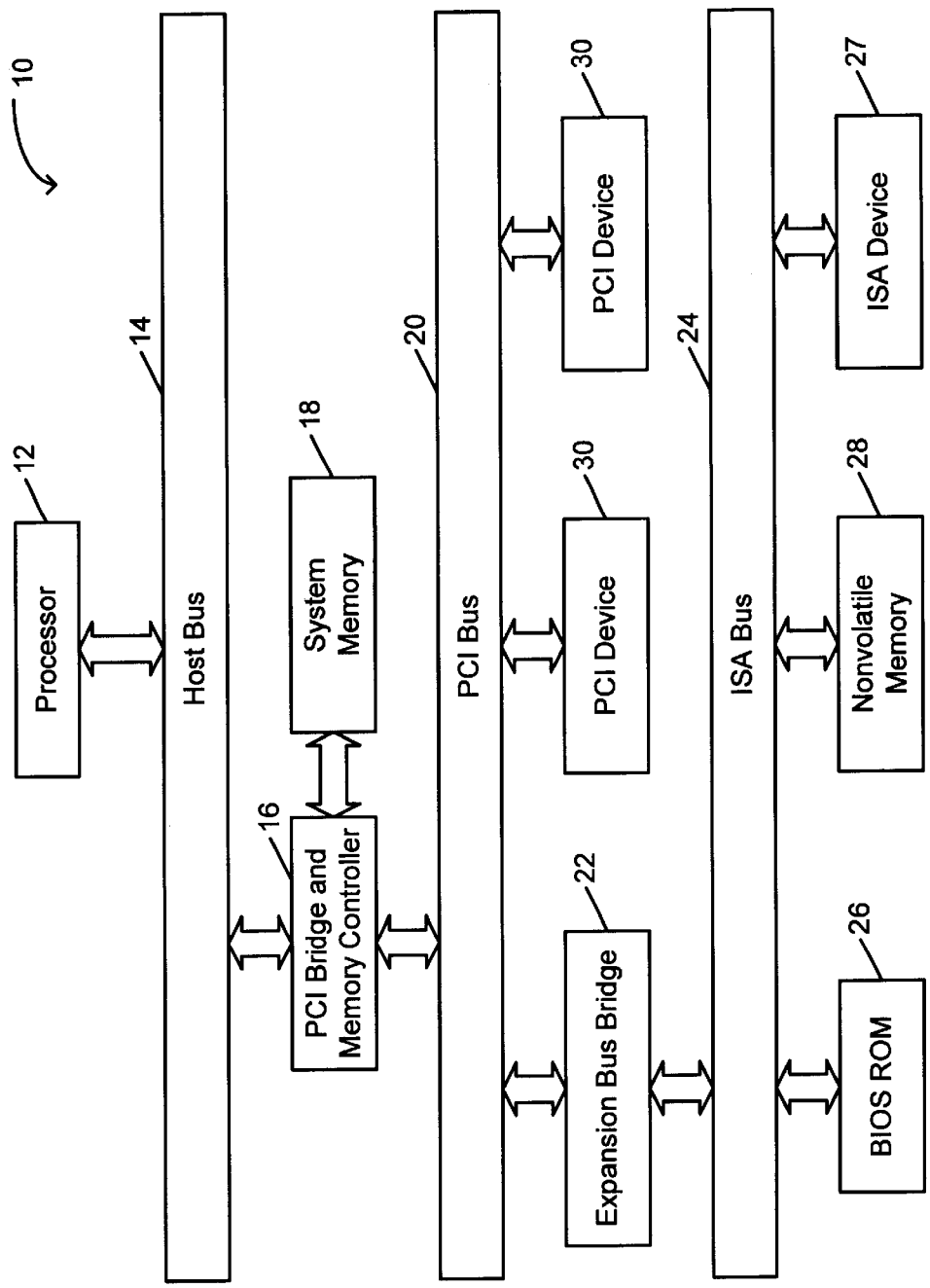
FIG. 1 is a diagram of the architecture of a computer system.

Shown in FIG. 1 is a block diagram of a computer system, which is indicated generally at 10. Computer system 10 includes processor 12, which is coupled to host bus 14. Also coupled to host bus 14 is a memory controller and PCI bridge 16, which is also is coupled to system memory 18 and a PCI bus 20. Coupled to PCI bus 20 are a number of PCI devices 30. Coupled to PCI bus 20 is an expansion bus bridge 22, which is coupled to expansion bus 24. As is common in some modern computer systems, expansion bus 24 may be an ISA bus, and expansion bridge 22 may be a PCI/ISA bridge. As an alternative, expansion bus 24 and expansion bridge 22 may operate according to another suitable expansion bus standard. Coupled to expansion bus 24 are a BIOS ROM 26, nonvolatile memory 28, and a number of ISA or expansion devices 27. Nonvolatile memory 28 may be an NVRAM or a CMOS memory.

Figure 2:
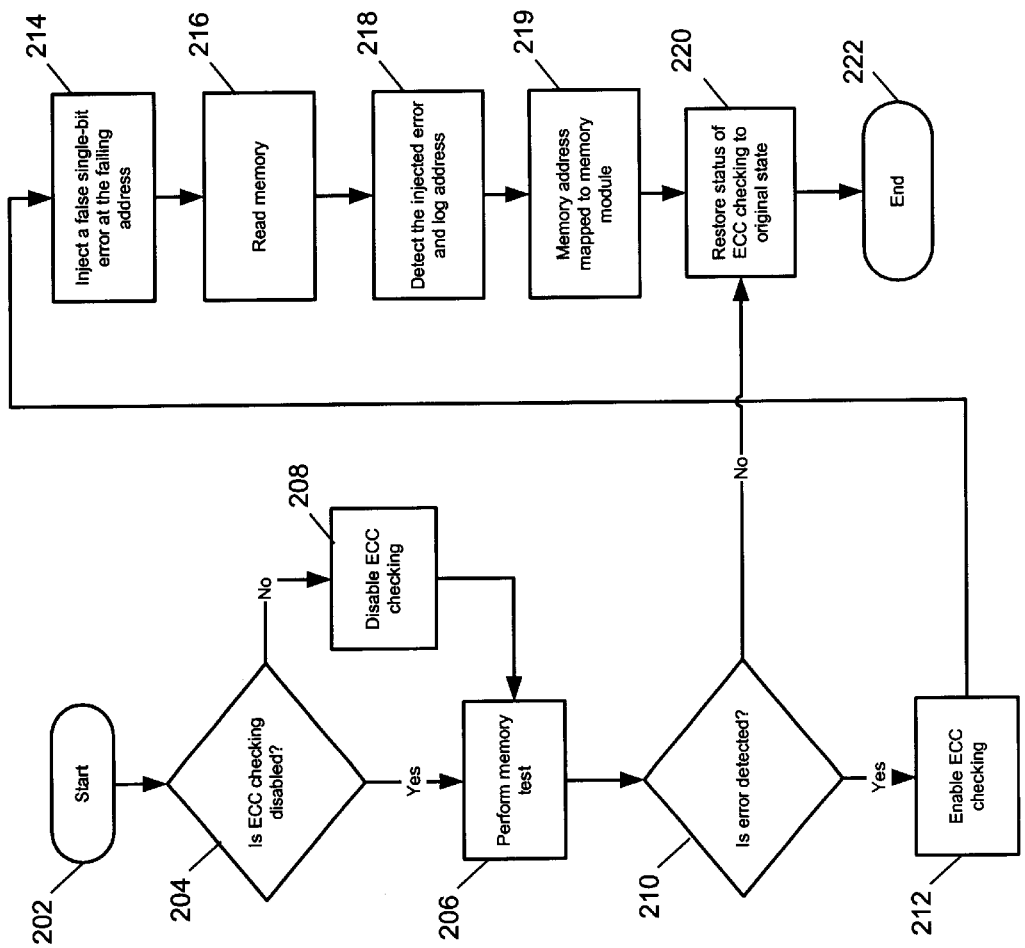
FIG. 2 is a flow diagram of the process of identify physical memory modules on the basis of failing or defective memory addresses.

Shown in FIG. 2 is a flow diagram of the process of identifying physical memory modules that have a defective or failing memory address. The memory modules described herein may reside in system memory 18 of FIG. 1. At step 204, it is determined whether ECC checking is disabled. If ECC checking is not disabled, ECC checking is disabled in step 208. The disabling of ECC checking in step 208 permits, in step 206, a standard memory test to be performed on the memory of the computer system. Testing memory with ECC checking disabled allows the memory addresses to be accessed for the sake of error identification while preventing the identified errors from being automatically and transparently corrected by ECC checking. Rather, errors in the system memory of the computer system, in the form of failing or defective addresses, are identified and recorded.

After the conclusion of the memory test of step 206, it is determined at step 210 if one or more errors were detected. If no errors were detected, processing continues at step 220, where ECC checking is return to its original operational state. ECC checking is enabled at step 220 if it was enabled when the status of ECC checking was first queried at step 204. ECC checking will remain disabled at step 220 if ECC checking was disabled when the status of ECC checking was first queried at step 204. If errors are detected during the memory test of step 206, processing continues at step 212 with the initiation of ECC checking. To this point in the method of FIG. 2, it is known that an error exists in the system memory of the computer system. The addresses of the failing or defective memory locations are also known.

In step 214, a single-bit error is injected into the failing or defective memory address or addresses that were identified in step 206, injection of error data into known addresses can occur by one of several techniques. One such technique involves the use of ECC error correction coding in which the data and its appended ECC data structure are coded such that the comparison of the data value to the data structure identifies a single-bit error in the data. The bit position of the error in the injected error data is the same as the bit position that was identified in step 206 as faulty or defective in the failing or defective memory address. In the case of multi-bit errors, a single-bit error is injected into the failing or defective memory address at step 206 even though more than one bit error is present in the failing or defective memory address. This is necessary because ECC checking has been enabled at step 212, and, if ECC checking encounters a multi-bit error, the computer system will typically halt.

Once the single-bit error data is injected at step 214, the data at the failing or defective memory address is read into memory. Reading this data into memory causes the ECC correction routine to detect the injected error at step 218. The ECC correction routines next attempts to correct the retrieved data. The ECC checking routine records the faulty memory address in a log. Because only a single memory address is being queried as part of this process, the ECC checking log is adequate. At step 219, the failing or defective memory address is mapped or associated with a physical memory module for the benefit of the administrator or user of the computer system. The step of mapping of failing or defective memory address to a physical memory is accomplished by existing routines or logic in the computer system. At step 220, ECC checking is returned to its original operational status (enabled or disabled) as of the time that the operational status of ECC checking was first queried at step 204. As a result of these method steps, the failing or defective memory address and its associated physical memory module are provided to the computer user or administrator.

Once the physical location of the failing memory module has been identified to the computer user or administrator, appropriate corrective actions may be taken. Examples of corrective actions include performing additional testing and monitoring, replacing the failing module, and reallocating memory resources. The present method provides users with the ability to locate memory modules with specific failing addresses and implement appropriate remedies, such as replacing failing modules.

One of the benefits of the present invention is the use of known logic and routines of the computer system to accomplish the steps of identifying physical memory modules having failing or defective addresses. Thus, the disclosed method for identifying physical memory modules involves the use of the built-in logic of the computer system. As a result, existing routines and logic of the computer system are used, and the practice of the disclosed method relieves any need for developing a new set of routines for performing memory module identification. Rather, existing logic and routines of the computer system can be ordered and initiated according to the disclosed method to accomplish the purpose of locating physical memory modules having failing or defective addresses. Moreover, because the steps of the present disclosure are performed by logic and routines found in any computer system, the present disclosure may apply without regard to the architecture of the computer system.

Although the present disclosure has been described in detail, it should be understood that various changes, substitutions, and alterations can be made hereto without departing from the spirit and the scope of the invention as defined by the appended claims.

What is claimed is:

1. A method for locating in a computer system memory modules on the basis of a failing or defective memory address, the computer system including a transparent memory error correction routine, comprising the steps of:

disabling the transparent memory error correction routine;

testing system memory in the computer system during the period that the transparent memory error correction routine is disabled;

enabling the transparent memory error correction routine;

writing a data value containing a bit error to the failing or defective address identified during the system memory test;

reading in data from the failing or defective address;

recording the failing or defective address; and identifying from the failing or defective address the associated physical memory module of the computer system.

2. The method for locating memory modules of claim 1, wherein the bit error is a single-bit error.

3. The method for locating memory modules of claim 1, wherein the data value written to the defective or failing address is associated with a data structure that identifies a single-bit error at the defective or failing memory address.

4. The method for locating memory modules of claim 1, wherein the step of recording the failing or defective address comprises the step of writing to a system event log the memory address that includes the data value containing the bit error.

5. The method of claim 1, wherein the step of identifying from the failing or defective access the associated physical memory module of the computer system comprises the step of correlating from a memory map the address of the bit error to a physical memory module.

6. The method for locating memory modules of claim 1, wherein the step of disabling the transparent memory error correction routine comprises the step of determining whether the transparent memory error correction routine is active and disabling the routine if the routine is determined to be active.

7. The method for locating memory modules of claim 6, further comprising the step of resetting the transparent memory error correction routine to its enable state if the transparent error correction routine was determined to be active and disabled.

8. The method for locating memory modules of claim 3, wherein the transparent memory error correction routine comprises an ECC checking routine.

9. The method for locating memory modules of claim 8, wherein the data structure comprises ECC error correction codes that identify the address as having a single-bit error.

10. A computer system, comprising:

system memory of multiple memory modules;

a transparent error correction routine for correcting memory errors;

a memory controller for controlling the operation of the system memory, wherein the memory controller is operable to disable the transparent error correction routine, test system memory during the period that the error correction routine is disabled, enable the transparent error correction routine, write a coded data value to a defective memory location identified during the system memory test, read in the coded data value from the defective memory location, such that the location of the defective memory location is identified to the computer system.

11. The computer system of claim 10, wherein the coded data value is a data value that is coded to indicate that the memory location includes a bit error.

12. The computer system of claim 11, wherein the bit error is a single-bit error.

13. The computer system of claim 10, wherein the transparent error correction routine is an ECC checking routine.

14. The computer system of claim 10, wherein the memory controller of the computer system is further operable to correlate the identification of the defective memory location to the physical memory module having the defective memory location.

15. The computer system of claim 12, wherein the transparent error correction routine is an ECC checking routine.

16. The computer system of claim 15, wherein the memory controller of the computer system is further operable to correlate the identification of the defective memory location to the physical memory module having the defective memory location.

17. A method for identifying in a computer system a physical memory module having a failing or defective memory address, the computer system including an error correction routine for transparently correcting memory errors in the memory of the computer system, comprising the steps of:

disabling in the computer system the error correction routine;

running a system memory test during the period that the error correction routine is disabled;

enabling the error correction routine;

writing a coded value to the failing or defective memory address identified during the system memory test;

reading the coded data value of the defective memory address; and detecting the error in the defective memory address.

18. The method for identifying a physical memory module having a failing or defective memory address of claim 17, further comprising the step of correcting the memory error in the defective memory address transparently by the error correction routine.

19. The method for identifying a physical memory module having a failing or defective memory address of claim 17, further comprising the step of recording the address of the defective memory address.

20. The method for identifying a physical memory module having a failing or defective memory address of claim 19, wherein the step of recording the address of the defective memory location comprises the step of recording in the system event log the address of the defective memory address.

21. The method for identifying a physical memory module having a failing or defective memory address of claim 20, further comprising the step of correlating the defective memory address to the physical memory module that includes the defective memory address.

* * * * *